US011972932B2

United States Patent
Nakahata et al.

(10) Patent No.: US 11,972,932 B2
(45) Date of Patent: Apr. 30, 2024

(54) DEPOSITION METHOD AND DEPOSITION APPARATUS

(71) Applicant: ULVAC, INC., Chigasaki (JP)

(72) Inventors: Toshihiko Nakahata, Chigasaki (JP); Kazuyoshi Hashimoto, Chigasaki (JP); Harumasa Yamaguchi, Chigasaki (JP)

(73) Assignee: Ulvac, Inc., Chigasaki (JP)

( * ) Notice: Subject to any disclaimer, the term of this patent is extended or adjusted under 35 U.S.C. 154(b) by 0 days.

(21) Appl. No.: 18/546,697

(22) PCT Filed: Nov. 9, 2021

(86) PCT No.: PCT/JP2021/041115
§ 371 (c)(1),
(2) Date: Aug. 16, 2023

(87) PCT Pub. No.: WO2023/286289
PCT Pub. Date: Jan. 19, 2023

(65) Prior Publication Data
US 2024/0038502 A1    Feb. 1, 2024

(30) Foreign Application Priority Data

Jul. 16, 2021   (JP) .................................. 2021-117579

(51) Int. Cl.
*H01J 37/32*       (2006.01)
*C23C 14/34*       (2006.01)

(52) U.S. Cl.
CPC .... *H01J 37/32577* (2013.01); *C23C 14/3492* (2013.01); *H01J 37/32183* (2013.01)

(58) Field of Classification Search
None
See application file for complete search history.

(56) References Cited

U.S. PATENT DOCUMENTS 3,709,007 A * 1/1973 Hirai ...................... B21B 38/10
                                                              72/10.7
3,906,767 A * 9/1975 Tanaka .................... B21B 31/32
                                                              72/13.4
(Continued)

FOREIGN PATENT DOCUMENTS

CN    101523569 A    9/2009
CN    102031504 A    4/2011
(Continued)

OTHER PUBLICATIONS

Office Action dated Dec. 16, 2021 in Japanese Application No. 2021-567838.

(Continued)

*Primary Examiner* — Srinivas Sathiraju
(74) *Attorney, Agent, or Firm* — SALIWANCHIK, LLOYD & EISENSCHENK

(57) ABSTRACT

[Object] To improve step coverage of a coating film
[Solving Means] A deposition apparatus that includes a first electrode, a second electrode, a first power supply source, a second power supply source, and a phase adjuster is used. The first power supply source includes a first high-frequency power source and a first matching circuit, the first high-frequency power source outputting first high-frequency power, the first matching circuit being connected between the first high-frequency power source and the first electrode. The second power supply source includes a second matching circuit that outputs second high-frequency power, the second high-frequency power having the same period as the first high-frequency power and being lower than the first high-frequency power. A second high-frequency power source is caused to output the second high-frequency power and the phase adjuster is caused to operate to provide a phase difference θ between a phase of the first high-frequency power and a phase of the second high-frequency power. A (Continued)

voltage value Vpp of the second high-frequency power and a capacitance value C1 of a first variable capacitor that correspond to the phase difference θ in a state where output impedance of the second high-frequency power source and load-side impedance connected to the second high-frequency power source match are detected. The voltage value Vpp and the capacitance value C1 are selected in combination in a predetermined range of the phase difference θ.

8 Claims, 7 Drawing Sheets

(56) References Cited

U.S. PATENT DOCUMENTS

| | | | | |
|---|---|---|---|---|
| 4,487,050 | A * | 12/1984 | Kajiwara | B21B 13/147 72/241.8 |
| 4,593,548 | A * | 6/1986 | Hashimoto | B21D 1/05 72/161 |
| 4,687,125 | A * | 8/1987 | Hashimoto | B65H 23/32 226/189 |
| 5,556,501 | A * | 9/1996 | Collins | H01J 37/32458 257/E21.252 |
| 6,251,792 | B1 * | 6/2001 | Collins | H01L 21/6831 257/E21.252 |
| 8,883,632 | B2 * | 11/2014 | Endo | H01L 21/76882 438/653 |
| 9,567,667 | B2 * | 2/2017 | Furukawa | C23C 14/3464 |
| 2002/0088776 | A1 * | 7/2002 | Nakano | H05H 1/46 219/121.54 |
| 2008/0110859 | A1 | 5/2008 | Koshiishi et al. | |
| 2008/0236493 | A1 * | 10/2008 | Sakao | H01J 37/32091 118/723 I |
| 2009/0188430 | A1 | 7/2009 | Matsuda et al. | |
| 2010/0206718 | A1 * | 8/2010 | Li | C23C 14/35 204/192.12 |
| 2013/0178059 | A1 * | 7/2013 | Endo | H01L 21/76883 438/653 |
| 2014/0231389 | A1 * | 8/2014 | Nagami | H01J 37/32706 156/345.28 |
| 2015/0000843 | A1 | 1/2015 | Koshiishi et al. | |
| 2015/0075971 | A1 * | 3/2015 | Furukawa | C23C 14/3485 204/192.15 |
| 2015/0122421 | A1 * | 5/2015 | Konno | H01J 37/32183 156/345.28 |
| 2016/0079037 | A1 * | 3/2016 | Hirano | H01J 37/32183 156/345.28 |
| 2017/0268097 | A1 * | 9/2017 | Nakamura | C23C 14/3407 |
| 2019/0115192 | A1 | 4/2019 | Koshiishi et al. | |
| 2019/0378701 | A1 * | 12/2019 | Fujii | C23C 14/34 |
| 2020/0411290 | A1 * | 12/2020 | Oliveti | H01J 37/32944 |
| 2021/0020411 | A1 * | 1/2021 | Savas | H01J 37/32899 |
| 2021/0079514 | A1 * | 3/2021 | Fujii | H01L 21/285 |
| 2021/0391148 | A1 * | 12/2021 | Oliveti | H01J 37/32183 |
| 2022/0059358 | A1 * | 2/2022 | Ventzek | H01J 37/32183 |
| 2022/0084792 | A1 * | 3/2022 | Savas | H01J 37/32715 |
| 2022/0254616 | A1 * | 8/2022 | Hudson | H01J 37/32642 |
| 2023/0141067 | A1 * | 5/2023 | Oliveti | H01J 37/32944 315/111.21 |

FOREIGN PATENT DOCUMENTS

| | | |
|---|---|---|
| JP | 8-302467 A | 11/1996 |
| JP | 2003-213409 A | 7/2003 |
| JP | 2012-518722 A | 8/2012 |

OTHER PUBLICATIONS

Office Action dated Jan. 19, 2022 in Japanese Application No. 2021-567838.

International Search Report dated Jan. 18, 2022 in International Application No. PCT/JP2021/041115.

Office Action dated Oct. 10, 2023 in Korean Application No. 10-2023-7024576.

Office Action dated Dec. 5, 2023 in Chinese Application No. 202180093627.4.

* cited by examiner

Test B
Phase difference θ : 60 degrees

Test B
Phase difference θ : 100 degrees

Test A
Phase difference θ : 100 degrees

Test B
Phase difference θ : 140 degrees

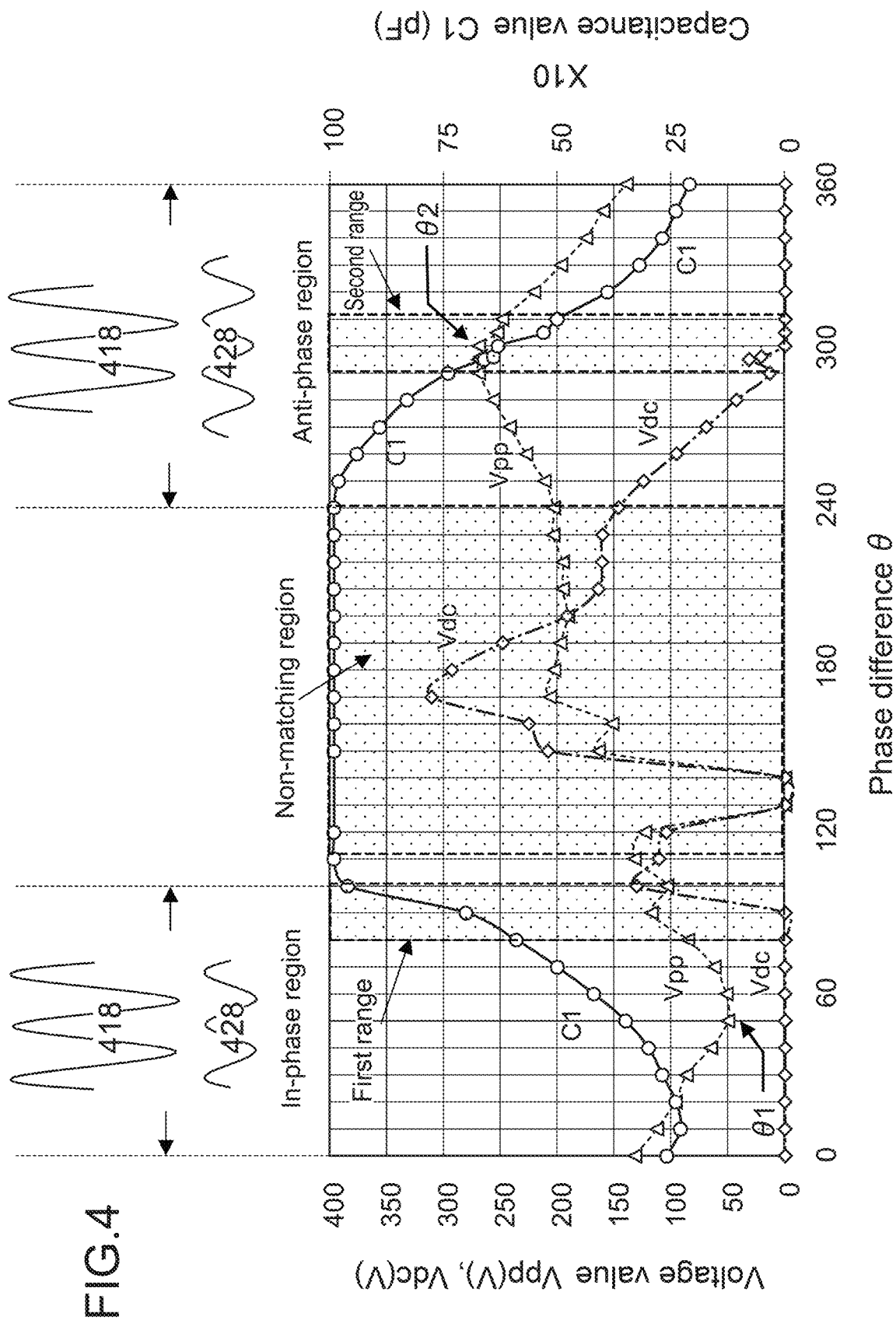

DEPOSITION METHOD AND DEPOSITION APPARATUS

CROSS-REFERENCE TO RELATED APPLICATIONS

This application is the U.S. national stage application of International Patent Application No. PCT/JP2021/041115, filed Nov. 9, 2021, which claims the benefit under 35 U.S.C. § 119 of Japanese Application No. 2021-117579, filed Jul. 16, 2021, the disclosures of each of which are incorporated herein by reference in their entirety.

TECHNICAL FIELD

The present invention relates to a deposition method and a deposition apparatus.

BACKGROUND ART

Electronic devices typified by 3D-NAND flash memories are becoming more multi-layered and the number of layers tends to increase more and more. For this reason, the deposition method of a coating film (e.g., an insulation layer) included in the multilayer structure is particularly important.

As a method of forming a coating film, there is a sputtering method, which has a relatively high deposition rate and exhibits a favorable film thickness distribution. Among these, there is a sputtering method in which high-frequency power is supplied to the sputtering target side and the substrate side and the phases of the respective high-frequency power sources are controlled to improve the deposition rate and film thickness distribution (see, for example, Patent Literature 1).

CITATION LIST

Patent Literature

Patent Literature 1: Japanese Patent Application Laid-open No. 1996-302467

DISCLOSURE OF INVENTION

Technical Problem

However, the embedding characteristics of the coating film formed by the deposition method described above change in some cases depending on the phase of the high-frequency power supplied to the substrate side. For this reason, an optimum condition with improved step coverage of the coating film is desired.

In view of the circumstances as described above, it is an object of the present invention to provide a deposition method and a deposition apparatus with improved step coverage of a coating film.

Solution to Problem

In order to achieve the above-mentioned object, in a deposition method according to an embodiment of the present invention, a deposition apparatus including a first electrode, a second electrode, a first power supply source, a second power supply source, and a phase adjuster is used.

The first electrode includes a sputtering target.

The second electrode faces the first electrode and is capable of supporting a substrate.

The first power supply source includes a first high-frequency power source and a first matching circuit, the first high-frequency power source outputting first high-frequency power, the first matching circuit being connected between the first high-frequency power source and the first electrode.

The second power supply source includes a second high-frequency power source and a second matching circuit, the second high-frequency power source outputting second high-frequency power that has the same period as the first high-frequency power and is lower than the first high-frequency power, the second matching circuit being connected between the second high-frequency power source and the second electrode and including an input terminal, an output terminal, a first variable capacitor, and a second variable capacitor, the input terminal being connected to the second high-frequency power source, the output terminal being connected to the second electrode, the first variable capacitor being connected between the input terminal and a ground potential, the second variable capacitor being connected between the input terminal and the output terminal in series.

The phase adjuster adjusts a phase of the first high-frequency power that is output from the first high-frequency power source and input to the first matching circuit and a phase of the second high-frequency power that is output from the second high-frequency power source and input to the second matching circuit.

The first high-frequency power source is caused to output the first high-frequency power to form discharge plasma between the first electrode and the second electrode.

The second high-frequency power source is caused to output the second high-frequency power and the phase adjuster is caused to operate to provide a phase difference $\theta$ between the phase of the first high-frequency power and the phase of the second high-frequency power.

A voltage value Vpp of the second high-frequency power and a capacitance value C1 of the first variable capacitor that correspond to the phase difference $\theta$ in a state where output impedance of the second high-frequency power source and load-side impedance connected to the second high-frequency power source match are detected.

The voltage value Vpp and the capacitance value C1 are selected in combination in a predetermined range of the phase difference $\theta$ to form a sputtering film on the substrate.

According to such a deposition method, a sputtering film with excellent step coverage is formed.

In the deposition method,
the phase difference $\theta$ may be formed by delaying the phase of the second high-frequency power with respect to the phase of the first high-frequency power;
a profile curve of the voltage value Vpp and a profile curve of the capacitance value C1 that correspond to the phase difference $\theta$ may be obtained by changing the phase difference $\theta$; and
the phase difference $\theta$ may be set in a first range or a second range and forming the sputtering film may be formed on the substrate in a state where the output impedance and the load-side impedance match, the first range being a range of +30 degrees to +50 degrees from a phase difference $\theta_1$ of the profile curve of the voltage value Vpp where the voltage value Vpp is the lowest, the second range being a range of +10 degrees to −10 degrees from a phase difference $\theta_2$ of the profile curve of the voltage value Vpp where the voltage value Vpp is the largest.

According to such a deposition method, a sputtering film with excellent step coverage is formed.

In the deposition method, the sputtering film may be formed on the substrate by changing the phase difference θ in a stepwise manner in the first range or the second range.

According to such a deposition method, a sputtering film with low damage and excellent step coverage is formed.

In the deposition method, after forming the sputtering film on the substrate in the first range or the second range, the sputtering film may be formed on the substrate in a third range in which the phase difference θ is smaller than the second range and larger than the first range.

According to such a deposition method, a sputtering film with low damage and excellent step coverage is formed.

In the deposition method, the third range may be a range of −50 degrees to −30 degrees from the phase difference θ2.

According to such a deposition method, a sputtering film with low damage and excellent step coverage is formed.

In order to achieve the above-mentioned object, a deposition apparatus according to an embodiment of the present invention, the controller stores data obtained by causing the first high-frequency power source to output the first high-frequency power to form discharge plasma between the first electrode and the second electrode, causing the second high-frequency power source to output the second high-frequency power and causing the phase adjuster to operate to provide a phase difference θ between the phase of the first high-frequency power and the phase of the second high-frequency power, and detecting a voltage value Vpp of the second high-frequency power and a capacitance value C1 of the first variable capacitor that correspond to the phase difference θ in a state where output impedance of the second high-frequency power source and load-side impedance connected to the second high-frequency power source match.

The controller selects the voltage value Vpp and the capacitance value C1 in combination in a predetermined range of the phase difference θ to form a sputtering film on the substrate.

According to such a deposition apparatus, a sputtering film with excellent step coverage is formed.

In the deposition apparatus, the controller may store a profile curve of the voltage value Vpp and a profile curve of the capacitance value C1 that correspond to the phase difference θ obtained by forming the phase difference θ by delaying the phase of the second high-frequency power with respect to the phase of the first high-frequency power and changing the phase difference θ.

The controller may set the phase difference θ in a first range or a second range and form the sputtering film on the substrate in a state where the output impedance and the load-side impedance match, the first range being a range of +30 degrees to +50 degrees from a phase difference θ1 of the profile curve of the voltage value Vpp where the voltage value Vpp is the lowest, the second range being a range of +10 degrees to −10 degrees from a phase difference θ2 of the profile curve of the voltage value Vpp where the voltage value Vpp is the largest.

According to such a deposition apparatus, a sputtering film with excellent step coverage is formed.

In the deposition apparatus, the sputtering film may be formed on the substrate by changing the phase difference θ in a stepwise manner in the first range or the second range.

According to such a deposition apparatus, a sputtering film with excellent step coverage is formed.

In the deposition apparatus, after forming the sputtering film on the substrate in the first range or the second range, the sputtering film may be formed on the substrate in a third range in which the phase difference θ is smaller than the second range and larger than the first range.

According to such a deposition apparatus, a sputtering film with excellent step coverage is formed.

In the deposition apparatus, the third range may be a range of −50 degrees to −30 degrees from the phase difference θ2.

According to such a deposition apparatus, a sputtering film with excellent step coverage is formed.

Advantageous Effects of Invention

As described above, according to the present invention, a deposition method and deposition apparatus with improved step coverage of a coating film are provided.

BRIEF DESCRIPTION OF DRAWINGS

FIGS. 3(a)-3(e) are each a cross-sectional SEM image of the sputtering film after the sputtering film is formed in the recessed pattern.

FIG. 4 shows profile curves of the voltage value Vpp and the capacitance value C1 in a test A.

MODE(S) FOR CARRYING OUT THE INVENTION

An embodiment of the present invention will be described below with reference to the drawings. Further, the same members or members having the same function will be denoted by the same reference symbols in some cases, and the description will be omitted as appropriate in some cases after describing the members. Further, numerical values shown below are examples and the present invention is not limited to these examples.

(Deposition Apparatus)

Figure 1:
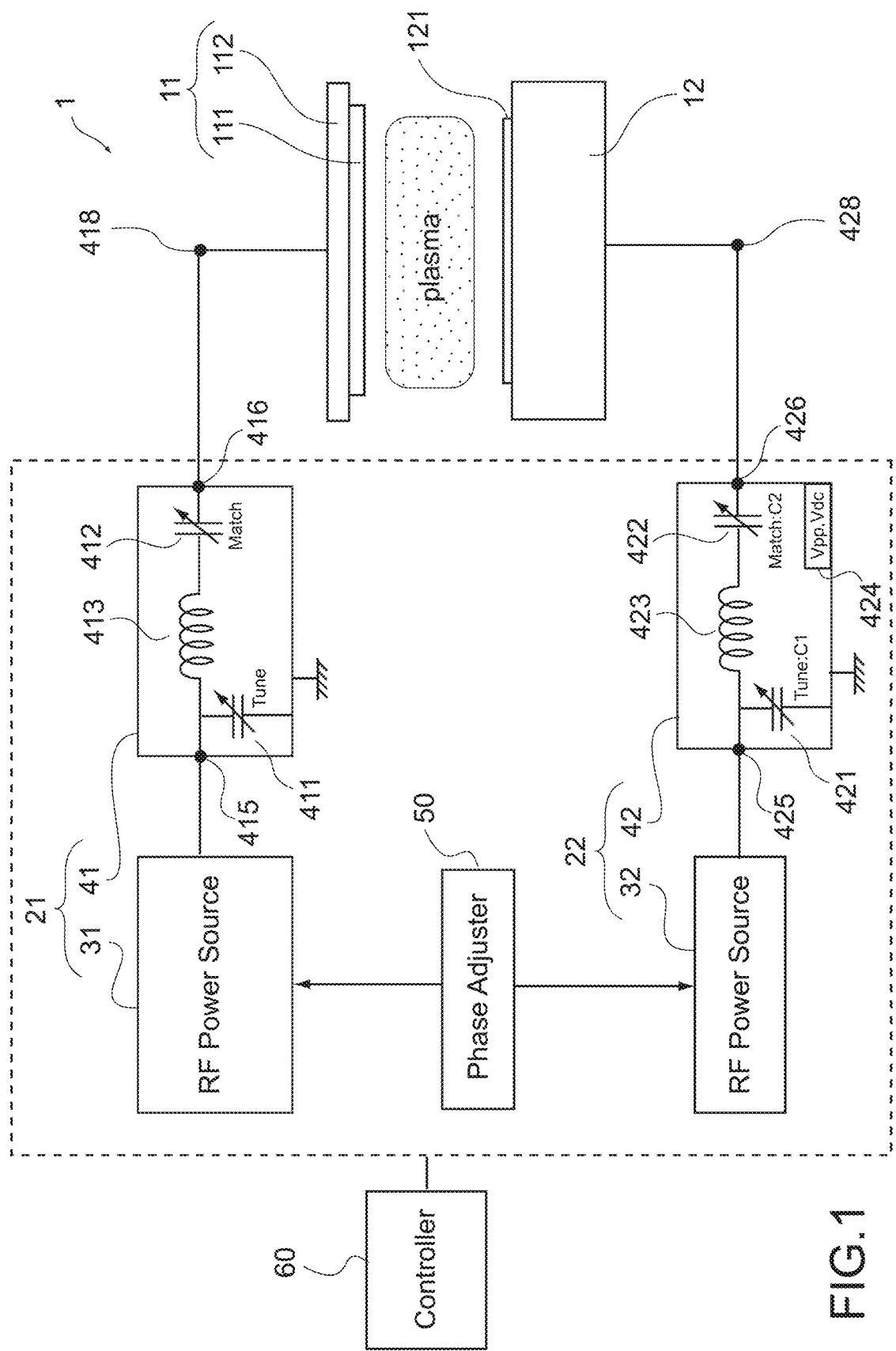
FIG. 1 is a schematic block configuration diagram showing an example of a deposition apparatus according to this embodiment.

FIG. 1 is a schematic block configuration diagram showing an example of a deposition apparatus according to this embodiment.

A deposition apparatus 1 includes an electrode 11 (first electrode), an electrode 12 (second electrode), a power supply source 21 (first power supply source), a power supply source 22 (second power supply source), a phase adjuster 50, and a controller 60.

The electrode 11 includes a sputtering target 111 and a back plate (support plate) 112. The sputtering target 111 contains a coating material to be sputter-deposited on a substrate 121. Examples of the coating material include alumina, an insulator such as silicon oxide, and a metal such as aluminum. The back plate 112 is formed of, for example, a conductive metal.

The electrode 12 faces the electrode 11. The electrode 12 functions also as a support stand capable of supporting the substrate 121. An electrostatic chuck may be provided on the support surface of the electrode 12 supporting the substrate 121. The substrate 121 includes a semiconductor wafer, a silicon oxide layer, and the like. Patterns such as lines and spaces and through holes are formed on the deposition surface of the substrate 121 facing the electrode 11.

The power supply source 21 includes a high-frequency power source 31 (first high-frequency power source) and a matching circuit 41 (first matching circuit). The high-frequency power source 31 outputs first high-frequency power. The first high-frequency power is typically RF power of 13.56 MHz. For example, 100 W to 5000 W can be output.

The matching circuit 41 is connected between the high-frequency power source 31 and the electrode 11. The matching circuit 41 includes an input terminal 415, an output terminal 416, a variable capacitor 411, a variable capacitor 412, and an inductance 413. The input terminal 415 is connected to the high-frequency power source 31. The output terminal 416 is connected to the electrode 11. The variable capacitor 411 is connected to the input terminal 415 and a ground potential. The variable capacitor 412 is connected between the input terminal 415 and the output terminal 416 in series. The inductance 413 is connected to the variable capacitor 412 between the input terminal 415 and the output terminal 416 in series. Each of the variable capacitor 411 and the variable capacitor 412 of the matching circuit 41 is driven by the controller 60 to perform automatic matching in which the output impedance of the high-frequency power source 31 and the load-side impedance (impedance on the side of the electrode 11) connected to the high-frequency power source 31 match.

The load-side impedance connected to the high-frequency power source 31 includes the electrode 11, a cable between the electrode 11 and the matching circuit 41, discharge plasma, a vacuum chamber (not shown) housing the electrodes 11 and 12, and the like.

The power supply source 22 includes a high-frequency power source 32 (second high-frequency power source) and a matching circuit 42 (second matching circuit). The high-frequency power source 32 outputs second high-frequency power that has the same period as the first high-frequency power and is lower than the first high-frequency power. The second high-frequency power is typically RF power of 13.56 MH, and 50 W to 500 W can be output. Note that the high-frequency power is not limited to this example as long as it is in the same frequency band.

The matching circuit 42 is connected between the high-frequency power source 32 and the electrode 12. The matching circuit 42 includes an input terminal 425, an output terminal 426, a variable capacitor 421 (first variable capacitor), a variable capacitor 422 (second variable capacitor), and an inductance 423. The input terminal 425 is connected to the high-frequency power source 32. The output terminal 426 is connected to the electrode 12. The variable capacitor 421 is connected between the input terminal 425 and a ground potential. The variable capacitor 422 is connected between the input terminal 425 and the output terminal 426 in series. The inductance 423 is connected to the variable capacitor 422 between the input terminal 425 and the output terminal 426 in series. Each of the variable capacitor 421 and the variable capacitor 422 of the matching circuit 42 is driven by the controller 60 to perform automatic matching in which the output impedance of the high-frequency power source 32 and the load-side impedance (impedance on the side of the electrode 12) connected to the high-frequency power source 32 match.

The load-side impedance connected to the high-frequency power source 32 includes the electrode 12, a cable between the electrode 12 and the matching circuit 42, discharge plasma, a vacuum chamber (not shown) housing the electrodes 11 and 12, and the like.

Here, the capacitance of the variable capacitor 421 is represented by the capacitance value C1 (maximum 1000 pF), the capacitance (maximum 500 pF) of the variable capacitor 422 is represented by a capacitance value C2. Further, a sensor 424 that detects a voltage value Vpp (Voltage peak to peak) of high-frequency power in the matching circuit 42 and a voltage value Vdc (Voltage direct current) at the output terminal 426 is mounted on the matching circuit 42. The voltage value Vpp means the difference between the maximum voltage and the minimum voltage of the AC voltage. The voltage value Vdc means the voltage at the midpoint between the maximum value and the minimum value of Vpp while the voltage of the voltage value Vpp applied to the electrode 12 floats at an entirely constant voltage. The voltage value Vdc is referred to also as an offset voltage or a bias voltage. In the case of RF discharge, the voltage value Vdc is generally a low potential with respect to a plasma potential (Vp). For example, if the plasma potential is a positive potential, the voltage value Vdc is a potential lower than this positive potential or is a negative potential.

Note that in the matching circuit 42, the variable capacitor 421 is mainly applied to match the output impedance of the high-frequency power source 32 and the load-side impedance connected to the high-frequency power source 32, and the variable capacitor 422 is mainly applied to match the phase of a voltage wave and the phase of a current wave.

Therefore, even when the output impedance of the high-frequency power source 32 and the load-side impedance connected to the high-frequency power source 32 match, the second high-frequency power is preferentially supplied from the input terminal 425 to the output terminal 426, part of the second high-frequency power is discharged to the ground potential, or the second high-frequency power is does not reach the output terminal 426 and is discharged to the ground potential, depending on the capacitance value C1 of the variable capacitor 421. For example, the second high-frequency power is more preferentially supplied from the input terminal 425 to the output terminal 426 as the capacitance value C1 of the variable capacitor 421 becomes relatively larger.

In the power supply source 22, the high-frequency power source 32 includes a display unit, and the voltage value Vpp, the voltage value Vdc, the capacitance value C1, and the capacitance value C2 are displayed on this display unit. Further, these values are transmitted to the controller 60 and stored in a storage unit (not shown) within the controller 60. Note that such a sensor 424 may be mounted also on the matching circuit 41.

The phase adjuster 50 is capable of adjusting the phase of the first high-frequency power that is output from the high-frequency power source 31 and input to the matching circuit 41. The phase adjuster 50 is capable of adjusting the phase of the second high-frequency power that is output from the high-frequency power source 32 and input the matching circuit 42. The phase adjuster 50 is capable of providing a phase difference θ between the phase of the first high-frequency power and the phase of the second high-frequency power.

The controller 60 controls the power supply source 21, the power supply source 22, and the phase adjuster 50. The controller 60 may be provided independently of the power supply source 21, the power supply source 22, and the phase adjuster 50, and part of the controller 60 may be incorporated in one of the power supply source 21, the power supply source 22, and the phase adjuster 50. The controller 60 includes a storage unit that stores data, a calculation unit that perform arithmetic processing on data, and the like.

(Deposition Method)

In this embodiment, profile curves of the voltage value Vpp and the capacitance value C1 that corresponds to the phase difference θ are acquired in advance. A dummy substrate may be used as the substrate 121 at the stage of acquiring this profile curve.

First, the high-frequency power source 31 is caused to output the first high-frequency power to form discharge plasma between the electrode 11 and the electrode 12. As the discharge gas, for example, argon is applied. The output impedance of the high-frequency power source 31 and the load-side impedance (impedance on the side of the electrode 11) connected to the high-frequency power source 31 are caused to match by the matching circuit 41.

Next, the high-frequency power source 32 is caused to output the second high-frequency power and the phase adjuster 50 is caused to operate so that the phase difference θ between the phase of the first high-frequency power and the phase of second high-frequency power is provided. Here, each of the first high-frequency power and the second high-frequency power is not changed, and is set to a fixed value. Further, the second high-frequency power is lower than the first high-frequency power and is set to, for example, 1/10 to 1/2 of the first high-frequency power.

Next, while the discharge plasma is formed between the electrode 11 and the electrode 12, the voltage value Vpp of the second high-frequency power and the capacitance value C1 of the variable capacitor 421 that correspond to the phase difference θ in a state where the output impedance of the high-frequency power source 32 and the load-side impedance (impedance on the side of the electrode 12) connected to the high-frequency power source 32 are caused to match by the matching circuit 42 are detected. Then, by changing the phase difference θ, a profile curve (FIG. 2(a)) of the voltage value Vpp corresponding to the phase difference θ and a profile curve (FIG. 2(b)) of the capacitance value C1 corresponding to the phase difference θ in a state where the output impedance of the high-frequency power source 32 and the load-side impedance connected to the high-frequency power source 32 match are acquired.

Here, the phase difference θ is formed by delaying the phase of the second high-frequency power with respect to the phase of the first high-frequency power by the phase adjuster 50, and is changed as appropriate in the range of 0 degrees to 360 degrees. For example, in the case of changing the phase difference θ from 0 degrees, it is changed from 0 degrees by a predetermined interval, e.g., every 10 degrees to 10 degrees, 20 degrees, . . . , 360 degrees. Then, a sputtering film is formed on the substrate 121 by selecting the voltage value Vpp and the capacitance value C1 in combination in a predetermined range of the changed phase difference θ. Here, forming a sputtering film on the substrate 121 means embedding a sputtering film in a recessed pattern (lines and spaces, through holes, and the like) formed on the substrate 121 and forming the sputtering film on the surface of the substrate 121 other than the recessed pattern. The sputtering film deposited on the surface of the substrate 121 other than the recessed pattern may be removed as an excess portion as necessary by a method such as a chemical mechanical polishing (CMP) after forming the sputtering film.

Figure 2A:
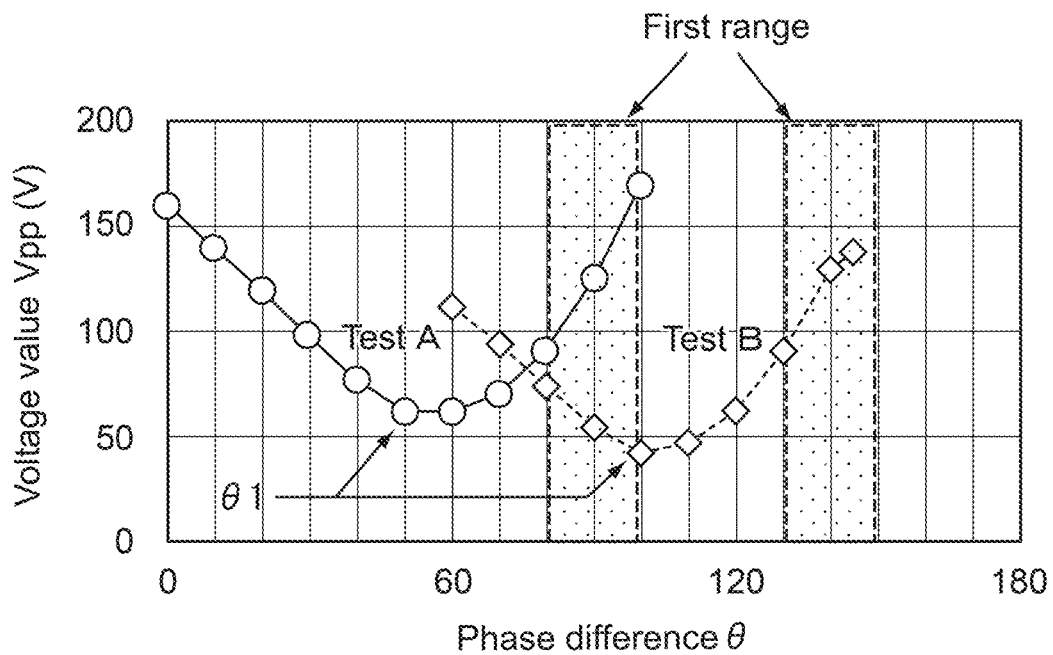
FIG. 2(a) is a graph describing an example of a profile curve of a voltage value Vpp.
Figure 2B:
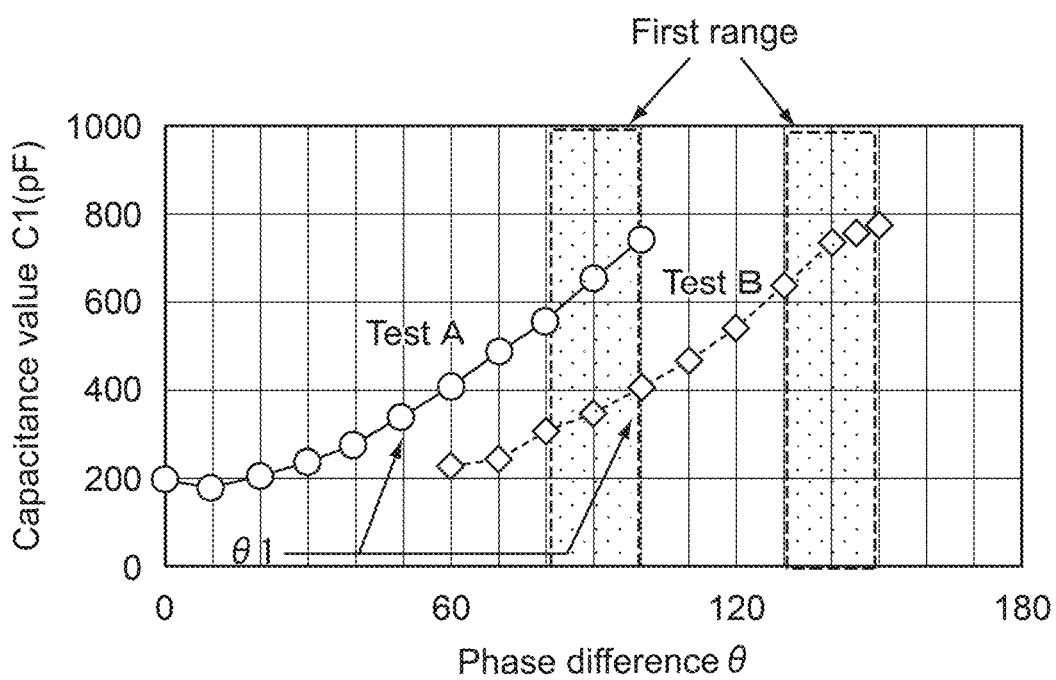
FIG. 2(b) is a graph describing an example of a profile curve of a capacitance value C1.

As described above, FIG. 2(a) is a graph describing an example of the profile curve of the voltage value Vpp. FIG. 2(b) is a graph describing an example of the profile curve of the capacitance value C1. In FIG. 2(a), the horizontal axis represents the phase difference θ and the vertical axis represents the voltage value Vpp. In FIG. 2(b), the horizontal axis represents the phase difference θ and the vertical axis represents the capacitance value C1. The first high-frequency power output from the high-frequency power source 31 is 4000 W, and the second high-frequency power output from the high-frequency power source 32 is 400 W. Further, the reduced pressure atmosphere is 0.1 to 4.0 Pa using argon gas. The distance between the sputtering target/substrate is 50 to 90 mm. Note that the higher Vdc shown in the graph, the stronger the bias potential to be applied to the electrode 12 toward the negative bias side.

For example, FIG. 2(a) shows the profile curves of the voltage value Vpp in two tests, i.e., a test A and a test B. The test A shows a profile curve in the case of using, as the high-frequency power source 32, a high-frequency power source that outputs the second high-frequency power whose phase is synchronized with the phase of the first high-frequency power output from the high-frequency power source 31.

Meanwhile, the test B shows a profile curve in the case of using, as the high-frequency power source 32, a high-frequency power source that outputs the second high-frequency power whose phase is advance by 50 degrees with respect to the phase of the first high-frequency power output from the high-frequency power source 31. This has the same meaning that the length of the cable between the high-frequency power source 32 and the matching circuit 42 has increased by the amount corresponding to 50 degrees due to the maintenance of the deposition apparatus 1 or the like. Note that in the test B, profile curves of the voltage value Vpp and the capacitance value C1 are acquired by a deposition chamber different from that in the test A.

In the test A, the voltage value Vpp is high when the phase difference θ is around 0 degrees, and the voltage value Vpp tends to gradually decrease as the phase difference θ increases. Then, the voltage value Vpp reaches its lowest value when the phase difference θ is 60 degrees, and then, the voltage value Vpp tends to gradually increase as the phase difference θ increases. Meanwhile, also in the test B, the voltage value Vpp is high when the phase difference θ is around 60 degrees, and the voltage value Vpp tends to gradually decrease as the phase difference θ increases. Then, the voltage value Vpp reaches its lowerst value when the phase difference θ is 110 degrees, and then, the voltage value Vpp tends to gradually increase as the phase difference θ increases.

In this way, in each of the profile curves of the voltage value Vpp in the test A and the test B, a downward convex curve is drawn.

Further, FIG. 2(b) shows profile curves of the capacitance value C1 in the test A and the test B. In the test A, the capacitance value C1 is low when the phase difference θ is around 0 degrees, and then, the capacitance value C1 tends to gradually increase as the phase difference θ increases. Meanwhile, also in the test B, the capacitance value C1 is low when the phase difference θ is around 60 degrees, and then, the capacitance value C1 tends to gradually increase as the phase difference θ increases.

In this embodiment, a sputtering film is formed on the substrate 121 by using these profile curves and setting the phase difference θ in a first range, and, the first range being a range of +30 degrees to +50 degrees from a phase difference θ1 of the profile curve of the voltage value Vpp where the voltage value Vpp is the lowest.

For example, in the test A, the phase difference θ1 where the voltage value Vpp is the lowest is 50 degrees, and the first range is a range of 80 degrees to 100 degrees. Further, in the test B, the phase difference θ1 where the voltage value Vpp is the lowest is 100 degrees, and the first range is a range of 130 degrees to 150 degrees. In this embodiment, the voltage value Vpp and the capacitance value C1 that belong to such a first range are applied to form a sputtering film on the substrate 121.

(Evaluation)

A difference between the sputtering film in the case where the voltage value Vpp and the capacitance value C1 that belong to the first range are applied and the sputtering film in the case where the voltage value Vpp and the capacitance value C1 that do not belong to the first range are applied will be described.

Figure 3A:
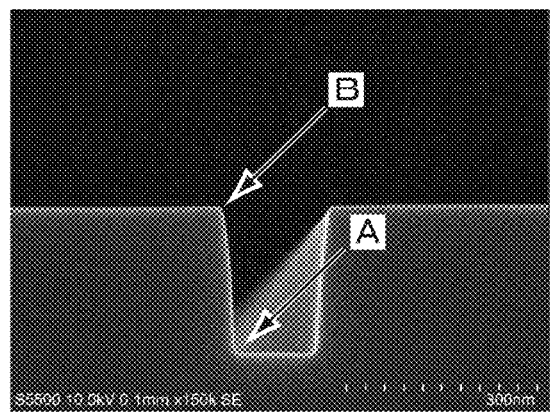
FIG. 3(a) is a cross-sectional SEM image of a recessed pattern before a sputtering film is formed.

FIGS. 3(a)-3(e) are each a cross-sectional SEM image. FIG. 3(a) is a cross-sectional SEM image of a recessed pattern before a sputtering film is formed. FIG. 3(a) shows a recessed pattern that is formed of silicon oxide and has a depth of 240 nm and an aspect ratio of 1.0. The portion indicated by an arrow A is an end portion where the bottom portion of the recessed pattern and a side wall intersect at approximately 90 degrees, and the portion indicated by an arrow B is a top end of the side wall. Further, FIGS. 3(b)-3(e) are each a cross-sectional SEM image of the sputtering film after a sputtering film is formed in the recessed pattern. FIGS. 3(b)-3(e) each show a state after an alumina film as a sputtering film is embedded in this recessed pattern.

Figure 3B:
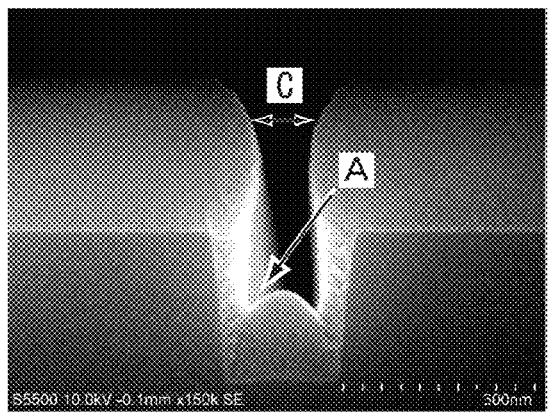
Figure 3C:
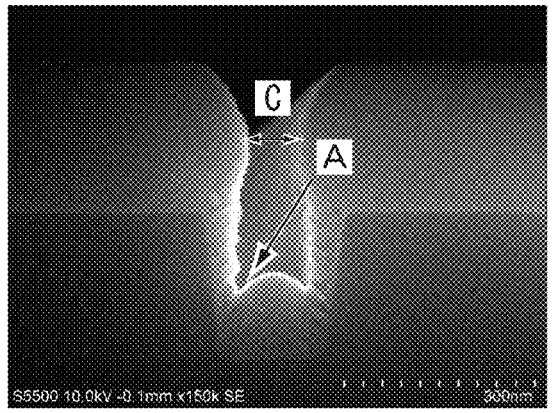

For example, as a sputtering film in the case of applying the phase difference θ that does not belong to the first range, a SEM image of a phase difference of 60 degrees (with reference to the minimum value of the profile curve of the voltage value Vpp, the phase difference θ on the left side of the minimum value) in the test B is shown in FIG. 3(b) and a SEM image of a phase difference 100 degrees (the minimum value of the profile curve of the voltage value Vpp) in the test B is shown in FIG. 3(c). In these alumina films, the wraparound to the end portion indicated by the arrow A was not excellent and a phenomenon in which the alumina film was recessed at an acute angle at the end portion appeared. Such a tendency was observed also in the test A. Further, it was confirmed that an opening indicated by an arrow C was narrower and the film would close at the upper part when the deposition was continued, forming a hole.

Figure 3D:
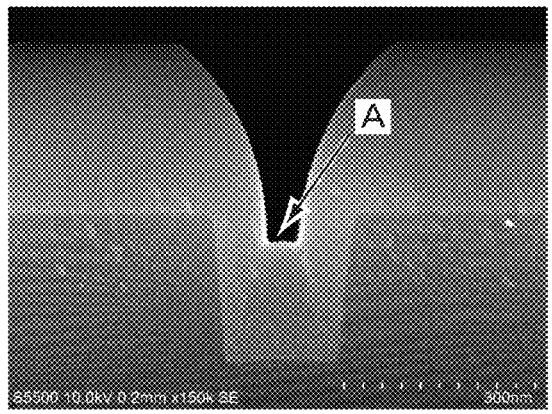
Figure 3E:
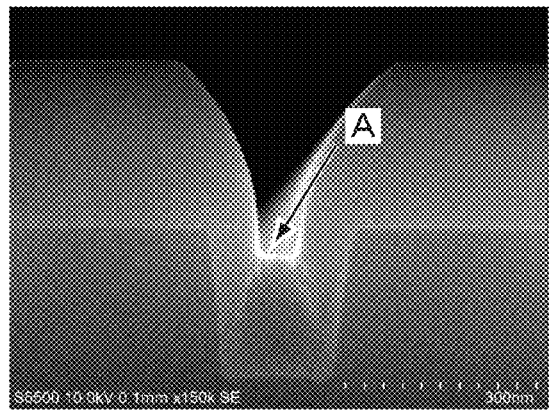

Meanwhile, as a sputtering film in the case of applying the phase difference θ that belongs to the first range, a SEM image of a phase difference of 100 degrees in the test A is shown in FIG. 3(d) and a SEM image of a phase difference of 140 degrees in the test B is shown in FIG. 3(e). In these alumina films, it was found that the alumina film was not recessed at an acute angle at the end portion and the alumina film with excellent step coverage was formed at the end portion. Further, even if the aspect ratio of the recessed pattern is 0.2 to 1.0, it was found that the wraparound to the end portion indicated by the arrow A was not excellent in the case of applying the phase difference θ that does not belong to the first range while an alumina film with excellent step coverage was formed by applying the phase difference θ that belongs to the first range.

In other words, since the profile curve of the voltage value Vpp is convex downward, the same voltage value as the voltage value Vpp that belongs to the first range is present outside the first range. Instead of selecting the voltage value Vpp outside the first range, the voltage value Vpp that belongs to the first range, of the same voltage values Vpp, and the capacitance value C1 that is a relatively high capacitance value are selected in combination, thereby forming an alumina film with excellent step coverage. Here, in the first range, the capacitance value C1 is set larger than the capacitance value C2.

Next, the results of further increasing the phase difference θ from 100 degrees will be described using the test A.

FIG. 4 shows the profile curves of the voltage value Vpp and the capacitance value C1 in the test A. In FIG. 4, the horizontal axis represents the phase difference θ, and the left vertical axis indicates the voltage value Vdc in addition to the voltage value Vpp and the voltage value Vpp. Further, the right vertical axis indicates the capacitance value C1. Further, FIG. 4 also shows the profile curve in the case where the phase difference θ is 0 degrees to 110 degrees described above.

When the phase difference θ exceeds 100 degrees and reaches 110 degrees to 240 degrees, the capacitance value C1 shook off the maximum capacitance value of 1000 pF and a phenomenon in which the output impedance of the high-frequency power source 32 and the load-side impedance connected to the high-frequency power source 32 could not match occurred. In this non-matching region (110 to 240 degrees), both the voltage value Vpp and the voltage value Vdc became unstable.

Meanwhile, when the phase difference θ exceeded 240 degrees and reached 250 degrees, the output impedance of the high-frequency power source 32 and the load-side impedance connected to the high-frequency power source 32 matched again. After that, the voltage value Vpp gradually increased as the phase difference θ increased, the voltage value Vpp reached its maximum value when the phase difference θ was 300 degrees, and then, the voltage value Vpp gradually decreased as the phase difference θ increased. Further, it was found that the capacitance value C1 is high when the phase difference θ is around 250 degrees, and then, the capacitance value C1 gradually decreases as the phase difference θ increases. It was found that the voltage value Vdc gradually decreases in the range of 240 degrees to 290 degrees where the voltage value Vpp increases.

As described above, it was found that the profile curve of the voltage value Vpp draws an upward convex curve when the phase difference θ is 250 degrees to 360 degrees.

As described above, it was confirmed that the voltage value Vpp is convex downward and the capacitance value C1 rises to the right in a region of the phase difference θ (referred to as an in-phase region) in which the phase of the waveform of the high-frequency voltage supplied to the electrode 11 and the phase of the waveform of the high-frequency voltage supplied to the electrode 12 match, and the voltage value Vpp is convex upward and the capacitance value C1 falls to the right in a region of the phase difference θ (referred to as an anti-phase region) in which the phase of the waveform of the high-frequency voltage supplied to the electrode 11 and the phase of the waveform of the high-frequency voltage supplied to the electrode 12 are deviated from each other.

In this embodiment, in a region where the phase difference θ is 250 degrees to 360 degrees, the phase difference θ is set in a second range and forms a sputtering film on the substrate 121, the second range being a range from +10 degrees to −10 degrees from a phase difference θ2 of the profile curve of the voltage value Vpp where the voltage value Vpp is the largest. For example, the phase difference θ2 where the voltage value Vpp is the largest is 300 degrees, and the second range is a range from 290 degrees to 310 degrees. Here, in the second range, the capacitance value C1 is set lager than the capacitance value C2.

A difference between the sputtering film in the case of applying the voltage value Vpp and the capacitance value C1 that belong to the second range and the sputtering film in the case of applying the voltage value Vpp and the capacitance value C1 that do not belong to the second range will be described.

Figure 5A:
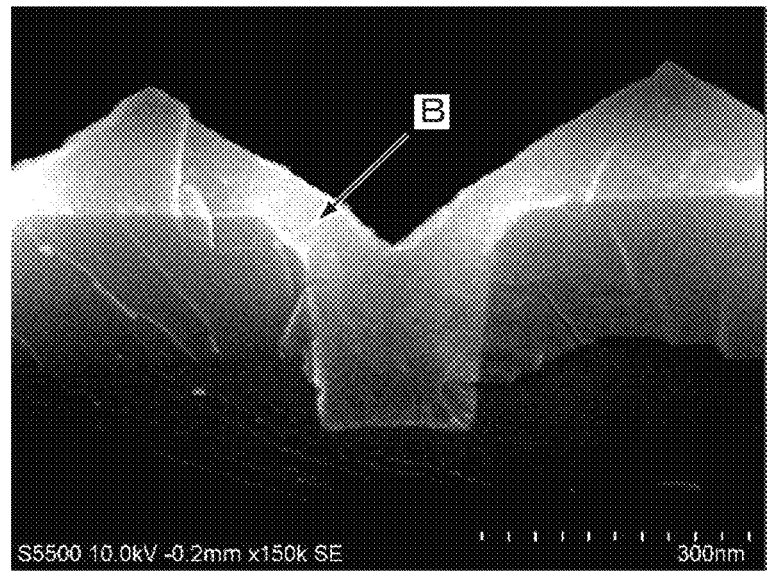
FIGS. 5(a) and 5(b) are cross-sectional SEM images of the sputtering film after the sputtering film is formed in the recessed pattern.
Figure 5B:
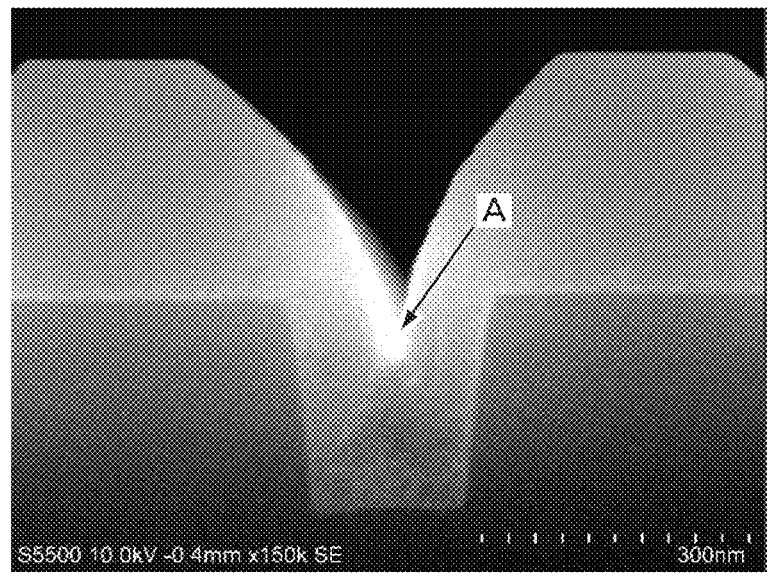

FIGS. 5(a) and 5(b) are each a cross-sectional SEM image of a sputtering film after the sputtering film is formed in the recessed pattern shown in FIG. 3(a).

For example, as an example of the sputtering film that does not belong to the first range and the second range, an example in which deposition is started on the empty recessed pattern under the condition of a phase difference of 260 degrees will be shown. FIG. 5(a) shows a SEM image of a phase difference of 260 degrees. In this case, it was confirmed that the voltage value Vdc becomes larger than 50 (V), the top end of recessed pattern indicated by an arrow B is etched, and the alumina film has a facet shape at this top end.

Meanwhile, as an example of the sputtering film that belongs to the second range, a SEM image of a phase difference of 300 degrees is shown in FIG. 5(b). In this alumina film, it was found that the wraparound to the end portion is improved, the alumina film is not recessed at an acute angle at the end portion, and an alumina film with excellent step coverage is formed at the end portion. It was confirmed that when the phase difference θ exceeds 310 degrees, the alumina film is recessed at an acute angle at the end portion.

As described above, it was found that even if both the first high-frequency power output from the high-frequency power source 31 and the second high-frequency power output from the high-frequency power source 32 are fixed power, the embedding characteristics of the sputtering film with respect to the recessed pattern change by manipulating the phase difference θ. In particular, it was found that a sputtering film exhibiting excellent step coverage is formed by setting the phase difference θ in the first range of +30 degrees to +50 degrees from the phase difference θ1 where the profile curve of the voltage value Vpp has the smallest value. Alternatively, it was found that a sputtering film exhibiting excellent step coverage is formed by setting the phase difference θ in the second range of +10 degrees to −10 degrees from the phase difference θ2 where the profile curve of the voltage value Vpp has the largest value.

Note that when the waveform of the high-frequency power at a position 418 (FIG. 1) between the electrode 11 and the matching circuit 41 and directly above the electrode 11 and a position 428 between the electrode 12 and the matching circuit 42 and directly below the electrode 12 was observed with an oscilloscope, it was confirmed that the phase of the waveform of the high-frequency voltage supplied to the electrode 11 and the phase of the waveform of the high-frequency voltage supplied to the electrode 12 match in the range from 0 degrees to 110 degrees, and the phase of the waveform of the high-frequency voltage supplied to the electrode 11 and the phase of the waveform of the high-frequency voltage supplied to the electrode 12 are displaced from each other in the range of 250 degrees to 360 degrees.

The controller 60 stores data of profile curves of the voltage value Vpp and the capacitance value C1 obtained in advance. The controller 60 selects the voltage value Vpp and the capacitance value C1 in combination in a predetermined range of the phase difference θ and form a sputtering film on the substrate 121.

For example, the controller 60 controls the phase adjuster 50 to set the phase difference θ in the first range (the voltage value Vpp: 80 to 130 (V)), the capacitance value C1: 600 pF or more) or the second range (the voltage value Vpp: 260 to 280 (V)), the capacitance value C1: 600 to 900 (pF), Vdc: 50 (V) or less) and form a sputtering film on the substrate 121 in a state where the output impedance of the high-frequency power source 32 and the load-side impedance match, the first range being a range of +30 degrees to +50 degrees from the phase difference θ1 of the profile curve of the voltage value Vpp where the voltage value Vpp is the lowest, the second range being a range of +10 degrees to −10 degrees from the phase difference θ2 of the profile curve of the voltage value Vpp where the voltage value Vpp is the largest.

As a result, a sputtering film exhibiting excellent step coverage with respect to the recessed pattern is formed.

Modified Example 1

In the first range or the second range, a sputtering film may be formed on the substrate 121 by changing the phase difference θ in a stepwise manner. When changing the phase difference θ in a stepwise manner, the first high-frequency power output from the high-frequency power source 31 is maintained at the same level. For example, the voltage value Vdc tends to increase as the capacitance value C1 increases. Then, as the voltage value Vdc increases, the recessed pattern underlying the sputtering film is more likely to be damaged by sputtering particles.

Therefore, a sputtering film may be formed in a recessed pattern by setting the phase difference θ such that the voltage value Vdc is low immediately after sputter-deposition, and the phase difference θ may be changed, e.g., the phase difference θ may be set such that the deposition rate increases to perform the sputter-deposition after a sputtering film having a predetermined thickness is embedded in the recessed pattern.

Modified Example 2

Figure 6:
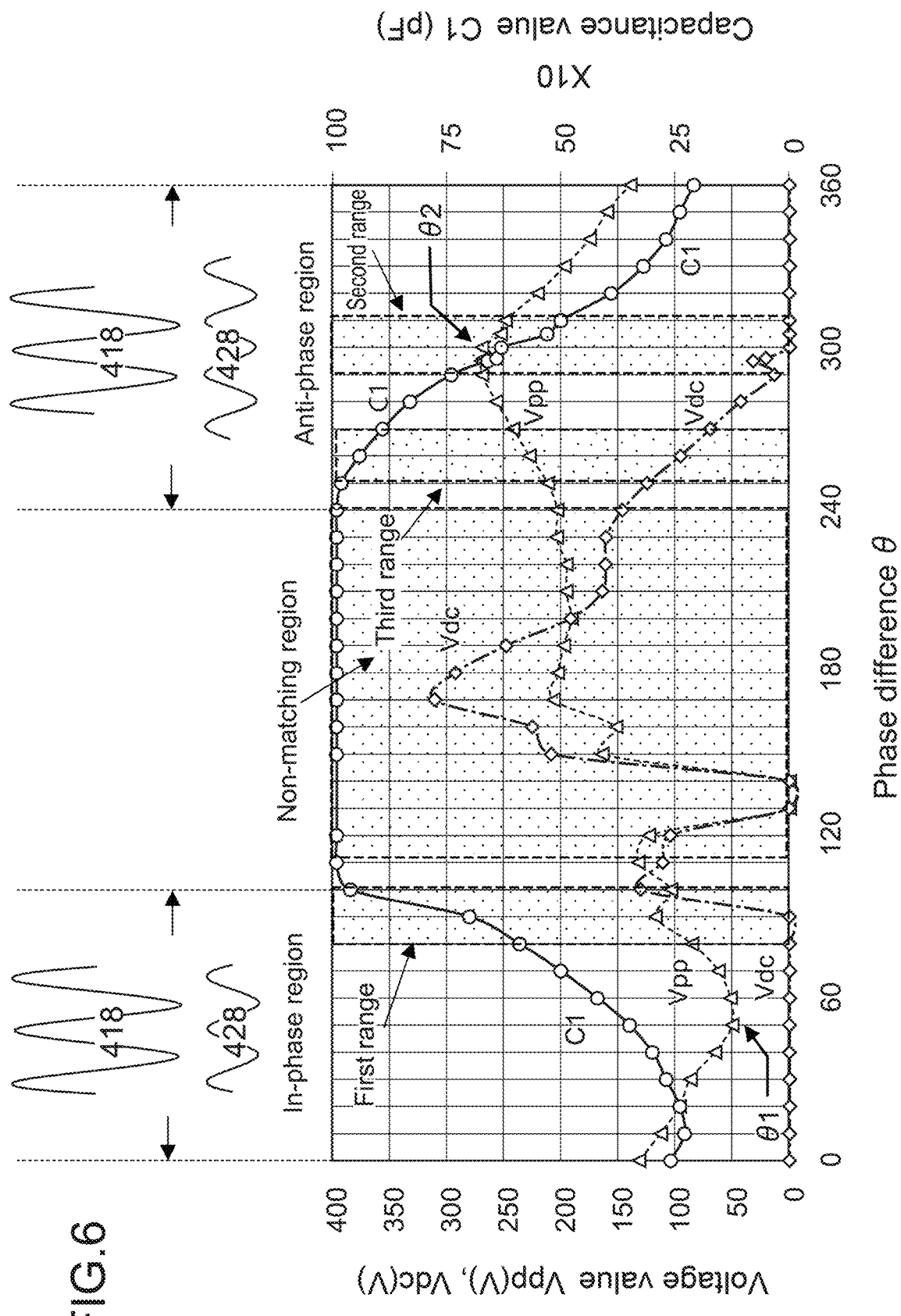
FIG. 6 shows profile curves of the voltage value Vpp and the capacitance value C1 according to a modified example 2.

FIG. 6 shows profile curves of the voltage value Vpp and the capacitance value C1 according to a modified example 2. In the modified example 2, a third range is used as a range of the phase difference θ in addition to the first and second ranges.

As in the example of FIG. 5(b), the top end of the recessed pattern is etched in the case of starting deposition on the empty recessed pattern under the condition of a phase difference of 260 degrees. However, in the case of adopting a process of changing the phase difference θ in a stepwise manner, excellent step coverage can be achieved by adopting deposition in the third range including a phase difference of 260 degrees as the phase difference θ in the latter of the stepwise Steps.

For example, a sputtering film is formed on the substrate 121 in the first range or the second range, and then, a sputtering film is formed on the substrate 121 in the third range. Here, the third range is a range in which the phase difference θ is smaller than the second range and larger than the first range. For example, the third range is a range of −50 degrees to −30 degrees from the phase difference θ2. The capacitance value C1 in the third range is 875 pF to 1000 pF. Note that when switching from the deposition in the first range or the second range to the deposition in the third range, the first high-frequency power output from the high-frequency power source 31 is maintained at the same level.

Figure 7A:
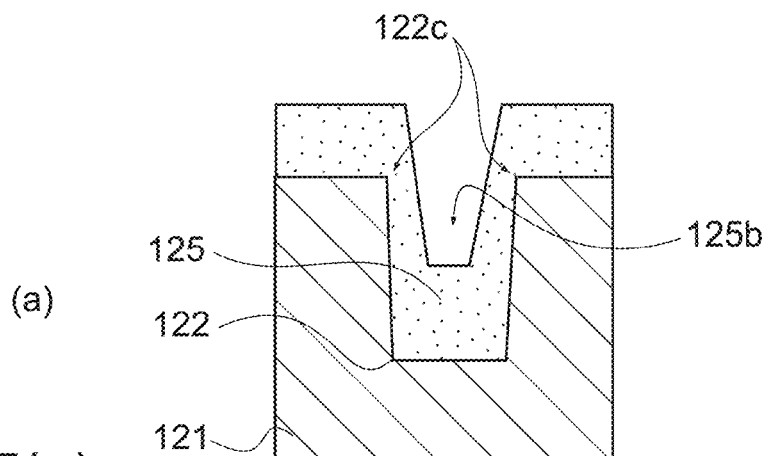
FIGS. 7(a) and 7(b) are each a schematic cross section showing a deposition method according to the modified example 2.
Figure 7B:
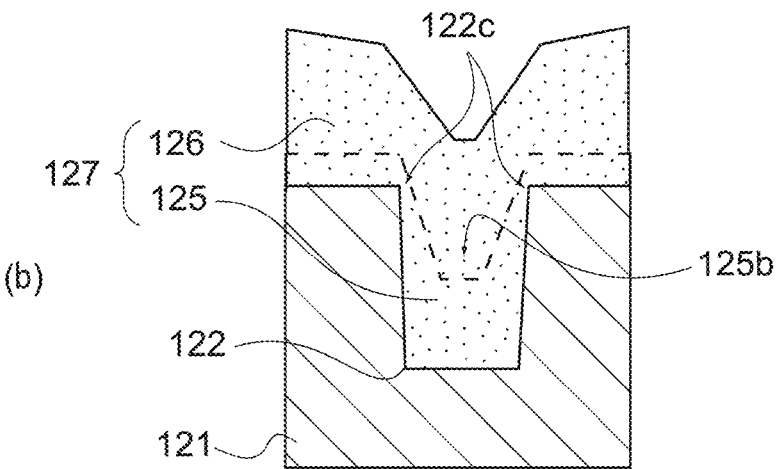
Figure 7C:
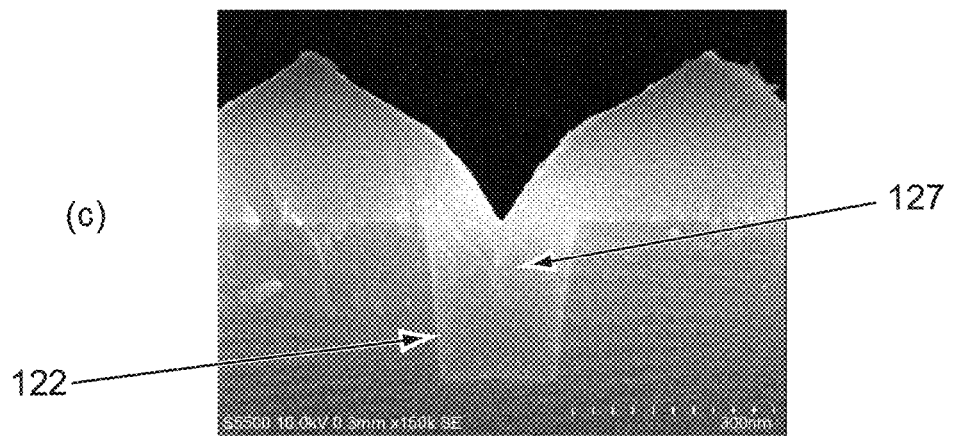
FIG. 7(c) is a cross-sectional SEM image of a sputtering film after a sputtering film is formed in a recessed pattern.

FIGS. 7(*a*) and 7(*b*) are each a schematic cross section showing a deposition method according to the modified example 2. Further, FIG. 7(*c*) is a cross-sectional SEM image of a sputtering film after the sputtering film is formed in a recessed pattern. The aspect ratio of a recessed pattern 122 shown in FIG. 7(*c*) is the same as the aspect ratio of the recessed pattern shown in FIG. 3(*a*).

For example, as shown in FIG. 7(*a*), a sputtering film 125 such as an alumina film is formed in the recessed pattern 122 formed of silicon oxide as a first Step under the condition that the phase difference θ is in the first range or the second range. As a result, the sputtering film 125 is formed in the recessed pattern 122. In the first Step, the sputtering film 125 is embedded while leaving an unfilled portion in the recessed pattern 122 instead of filling the entire inside of the recessed pattern 122 with the sputtering film 125. For example, regarding the target of film thickness in the first Step, the film thickness of the sputtering film 125 deposited on the portion (field portion) where the recessed pattern 122 is not formed is set to 40% to 60% of the opening width of the recessed pattern 122. Here, in the case where the recessed pattern 122 is lines and spaces, the opening width is an opening width of the recessed pattern 122 at the top end in the case of cutting the recessed pattern 122 in the direction in which the lines and spaces are arranged side by side. In the case where the recessed pattern 122 is a through hole, the opening width means the maximum diameter of the through hole at the top end. Further, in the first Step, a top end 122*c* of the recessed pattern 122 is covered (protected) with the sputtering film 125.

Here, in the recessed pattern 122, the sputtering film 125 is deposited from the bottom portion of the recessed pattern 122 and the sputtering film 125 is deposited also from the side wall of the recessed pattern 122. Therefore, in the sputtering film 125 formed in the recessed pattern 122, a recessed portion 125*b* that is recessed in the vicinity of the center of the sputtering film 125 is formed.

In the case of adopting a process in which the phase difference θ is not changed in a stepwise manner, in other words, in the case of continuing the deposition while the phase difference θ is in the first range or the second range, it is necessary to deposit the sputtering film 125 having a thickness equal to or larger than the depth of the recessed pattern 122 on the substrate 121 in order to fill the recessed pattern 122 with the sputtering film 125 until the recessed portion 125*b* disappears. However, as the thickness of the sputtering film 125 to be deposited on the substrate 121 increases, the burden on the CMP processing in the post-process increases. Further, the recessed portion 125*b* is more likely to be formed as the aspect ratio of the recessed pattern increases, and a phenomenon in which the recessed portion 125*b* remains as a void in the sputtering film 125 can occur when continuing the deposition in the first range or the second range.

In this regard, in the modified example 2, the deposition in the first range or the second range is stopped in the state of FIG. 7(*a*) and sputter-deposition is performed with the phase difference θ in the third range as the next Step. For example, after forming the sputtering film 125, a sputtering film 126 is formed under the condition that the phase difference θ is in the third range on the sputtering film 125. This state is shown in FIG. 7(*b*).

In the third range, the second high-frequency power is more preferentially supplied to the electrode 12 via the output terminal 426 as the capacitance value C1 increases, and the voltage value Vdc tends to increase more than in the first range and the second range. Therefore, simultaneously with the deposition of sputtering particles on the substrate 121, the bias potential applied to the substrate 121 attracts ion (e.g., positive ion) particles to the substrate 121, and physical etching of the sputtering film by the ion particles also occurs. Here, when the deposition of sputtering particles on the substrate 121 works better than the physical etching of the sputtering film by the ion particles, the sputtering film is formed on the substrate 121 while the sputtering film is physically etched.

As a result, in the sputter-deposition in the third range, the width of the recessed portion 125*b* is further widened by the etching effect. Further, in the sputtering film 125 covering the top end 122*c* of the recessed pattern 122, so-called film thinning (phenomenon in which the film thickness is reduced) occurs due the etching effect. Since the width of the recessed portion 125*b* is further widened, it is easier to fill the recessed portion 125*b* with the sputtering film. Further, since the top end 122*c* of the recessed pattern 122 is protected by the sputtering film 125, the top end 122*c* maintains its original shape without being etched.

Therefore, even if the recessed pattern 122 has a high aspect ratio, after the sputtering film 126 is formed, a sputtering film 127 having no void inside is formed in the recessed pattern 122 by the sputtering film 125 and the sputtering film 126 covering the sputtering film 125. The fact that the recessed pattern 122 is favorably filled with the sputtering film 127 having no void inside is confirmed also by the cross-sectional SEM image shown in FIG. 7(*c*).

In the modified example 2, the deposition with the phase difference θ in the third range may be performed after the deposition with the phase difference θ in the first range, or the deposition with the phase difference θ in the third range may be performed after the deposition with the phase difference θ in the second range.

Here, in order to switch from the phase difference θ in the first range to the phase difference θ in the third range, the phase difference θ only needs to be increased from the first range to the third range. However, in the case of shifting the phase difference θ from the first range to the third range, it is necessary to cause the phase difference θ to pass through the non-matching region before reaching the third range. For this reason, in this method, it is necessary to adopt deposition processing of temporarily stopping the plasma discharge after the deposition in the first range is performed and switching from the phase difference θ in the first range to the phase difference θ in the third range.

Meanwhile, in order to switch from the phase difference θ in the second range to the phase difference θ in the third range, the phase difference θ only needs to be decreased from the second range to the third range. In this case, even if the phase difference θ is shifted from the second range to the third range, the phase difference θ does not need to pass through a non-matching region because there is no non-matching region between the second range and the third range. For this reason, it is possible to switch, after the deposition in the second range is performed, to the third range by changing the phase difference θ in a continuous manner without stopping the plasma discharge.

Although embodiments of the present invention have been described above, the present invention is not limited only to the above-mentioned embodiments and it goes without saying that various modifications can be made. The respective embodiments are not limited to the independent form and can be combined as much as technologically possible.

REFERENCE SIGNS LIST 1 deposition apparatus
11 electrode
111 sputtering target
112 back plate
12 electrode
121 substrate
122c top end
122 recessed pattern
125, 126, 127 sputtering film
125b recessed portion
21, 22 power supply source
31, 32 high-frequency power source
41, 42 matching circuit
411, 412, 421, 422 variable capacitor
413, 423 inductance
415, 425 input terminal
416, 426 output terminal
424 sensor
50 phase adjuster
60 controller

The invention claimed is:

1. A deposition method, comprising:
by using a deposition apparatus including
a first electrode that includes a sputtering target,
a second electrode that faces the first electrode and is capable of supporting a substrate,
a first power supply source that includes a first high-frequency power source and a first matching circuit, the first high-frequency power source outputting first high-frequency power, the first matching circuit being connected between the first high-frequency power source and the first electrode,
a second power supply source that includes a second high-frequency power source and a second matching circuit, the second high-frequency power source outputting second high-frequency power that has the same period as the first high-frequency power and is lower than the first high-frequency power, the second matching circuit being connected between the second high-frequency power source and the second electrode and the second matching circuit including an input terminal, an output terminal, a first variable capacitor, and a second variable capacitor, the input terminal being connected to the second high-frequency power source, the output terminal being connected to the second electrode, the first variable capacitor being connected between the input terminal and a ground potential, the second variable capacitor being connected between the input terminal and the output terminal in series, and
a phase adjuster that adjusts a phase of the first high-frequency power that is output from the first high-frequency power source and input to the first matching circuit and a phase of the second high-frequency power that is output from the second high-frequency power source and input to the second matching circuit, causing the first high-frequency power source to output the first high-frequency power to form discharge plasma between the first electrode and the second electrode;
causing the second high-frequency power source to output the second high-frequency power and causing the phase adjuster to operate to provide a phase difference θ between the phase of the first high-frequency power and the phase of the second high-frequency power;
detecting a voltage value Vpp of the second high-frequency power and a capacitance value C1 of the first variable capacitor that correspond to the phase difference θ in a state where output impedance of the second high-frequency power source and load-side impedance connected to the second high-frequency power source match;
forming the phase difference θ by delaying the phase of the second high-frequency power with respect to the phase of the first high-frequency power;
obtaining a profile curve of the voltage value Vpp and a profile curve of the capacitance value C1 that correspond to the phase difference θ by changing the phase difference θ; and
forming a sputtering film on the substrate in a state where the output impedance and the load-side impedance match by setting the phase difference θ in a first range of the profile curve of the voltage value Vpp or a second range and selecting the voltage value Vpp and the capacitance value C1 in combination, the first range being a range of +30 degrees to +50 degrees from a phase difference θ1 of the profile curve of the voltage value Vpp where the voltage value Vpp is the lowest, the second range being a range of +10 degrees to −10 degrees from a phase difference θ2 where the voltage value Vpp is the largest.

2. The deposition method according to claim 1, further comprising
forming the sputtering film on the substrate by changing the phase difference θ in a stepwise manner in the first range or the second range.

3. The deposition method according to claim 1, further comprising
forming the sputtering film on the substrate in a third range in which the phase difference θ is smaller than the second range and larger than the first range after forming the sputtering film on the substrate in the first range or the second range.

4. The deposition method according to claim 3, wherein the third range is a range of −50 degrees to −30 degrees from the phase difference θ2.

5. A deposition apparatus, comprising:
a first electrode that includes a sputtering target;
a second electrode that faces the first electrode and is capable of supporting a substrate;
a first power supply source that includes a first high-frequency power source and a first matching circuit, the first high-frequency power source outputting first high-frequency power, the first matching circuit being connected between the first high-frequency power source and the first electrode;
a second power supply source that includes a second high-frequency power source and a second matching circuit, the second high-frequency power source outputting second high-frequency power that has the same period as the first high-frequency power and is lower than the first high-frequency power, the second matching circuit being connected between the second high-frequency power source and the second electrode and the second matching circuit including an input terminal, an output terminal, a first variable capacitor, and a second variable capacitor, the input terminal being connected to the second high-frequency power source, the output terminal being connected to the second electrode, the first variable capacitor being connected between the input terminal and a ground potential, the second variable capacitor being connected between the input terminal and the output terminal in series;

a phase adjuster that adjusts a phase of the first high-frequency power that is output from the first high-frequency power source and input to the first matching circuit and a phase of the second high-frequency power that is output from the second high-frequency power source and input to the second matching circuit; and a controller that controls the first power supply source, the second power supply source, and the phase adjuster, the controller storing data obtained by causing the first high-frequency power source to output the first high-frequency power to form discharge plasma between the first electrode and the second electrode, causing the second high-frequency power source to output the second high-frequency power and causing the phase adjuster to operate to provide a phase difference θ between the phase of the first high-frequency power and the phase of the second high-frequency power, and detecting a voltage value Vpp of the second high-frequency power and a capacitance value C1 of the first variable capacitor that correspond to the phase difference θ in a state where output impedance of the second high-frequency power source and load-side impedance connected to the second high-frequency power source match, the controller storing a profile curve of the voltage value Vpp and a profile curve of the capacitance value C1 that correspond to the phase difference θ obtained by forming the phase difference θ by delaying the phase of the second high-frequency power with respect to the phase of the first high-frequency power and changing the phase difference θ, the controller setting the phase difference θ in a first range or a second range and selecting the voltage value Vpp and the capacitance value C1 in combination, the first range being a range of +30 degrees to +50 degrees from a phase difference θ1 of the profile curve of the voltage value Vpp where the voltage value Vpp is the lowest, the second range being a range of +10 degrees to −10 degrees from a phase difference θ2 where the voltage value Vpp is the largest to form a sputtering film on the substrate in a state where the output impedance and the load-side impedance match.

6. The deposition apparatus according to claim 5, further comprising forming the sputtering film on the substrate by changing the phase difference θ in a stepwise manner in the first range or the second range.

7. The deposition apparatus according to claim 5, further comprising forming the sputtering film on the substrate in a third range in which the phase difference θ is smaller than the second range and larger than the first range after forming the sputtering film on the substrate in the first range or the second range.

8. The deposition apparatus according to claim 7, wherein the third range is a range of −50 degrees to −30 degrees from the phase difference θ2.

* * * * *